United States Patent
Sunohara et al.

(10) Patent No.: US 7,279,771 B2
(45) Date of Patent: Oct. 9, 2007

(54) WIRING BOARD MOUNTING A CAPACITOR

(75) Inventors: Masahiro Sunohara, Nagano (JP); Kei Murayama, Nagano (JP); Mitsutoshi Higashi, Nagano (JP); Toshio Gomyo, Nagano (JP); Yukiharu Takeuchi, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 93 days.

(21) Appl. No.: 11/090,029

(22) Filed: Mar. 28, 2005

(65) Prior Publication Data

US 2005/0218502 A1  Oct. 6, 2005

(30) Foreign Application Priority Data

Mar. 31, 2004  (JP)  ............................ 2004-104660

(51) Int. Cl.
*H01L 29/00* (2006.01)
*H05K 1/14* (2006.01)
*H05K 1/03* (2006.01)

(52) U.S. Cl. ...................... 257/516; 257/532; 257/701; 257/758; 257/774; 361/738; 361/763; 361/821; 174/255; 174/260

(58) Field of Classification Search ...................... None
See application file for complete search history.

(56) References Cited

U.S. PATENT DOCUMENTS 6,388,207 B1 * 5/2002 Figueroa et al. ............ 174/262
6,577,490 B2 * 6/2003 Ogawa et al. ............. 361/306.1
6,724,638 B1 * 4/2004 Inagaki et al. .............. 361/763
6,914,322 B2 * 7/2005 Iijima et al. ................ 257/678
6,970,362 B1 * 11/2005 Chakravorty ............... 361/782
2002/0086561 A1 * 7/2002 Ogawa et al. ................ 439/55
2004/0090758 A1 * 5/2004 Horikawa .................... 361/782

FOREIGN PATENT DOCUMENTS

| JP | 07263619 A | * 10/1995 |
| JP | 11045955 A | * 2/1999 |
| JP | 11-68319 | 3/1999 |
| JP | 11317490 A | * 11/1999 |

* cited by examiner

*Primary Examiner*—Alonzo Chambliss
(74) *Attorney, Agent, or Firm*—Kratz, Quintos & Hanson, LLP

(57) ABSTRACT

In a capacitor-mounted wiring board, a plurality of wiring layers each patterned in a required shape are stacked with insulating layers interposed therebetween and are connected to each other via conductors formed to pierce the insulating layers in the direction of thickness. A decoupling capacitor is electrically connected to a wiring layer used as a power supply line or a ground line in the vicinity of the wiring layer, and mounted such that, when a current is passed through the capacitor, the direction of the current is reversed to that of the current flowing through the relevant wiring layer.

5 Claims, 14 Drawing Sheets

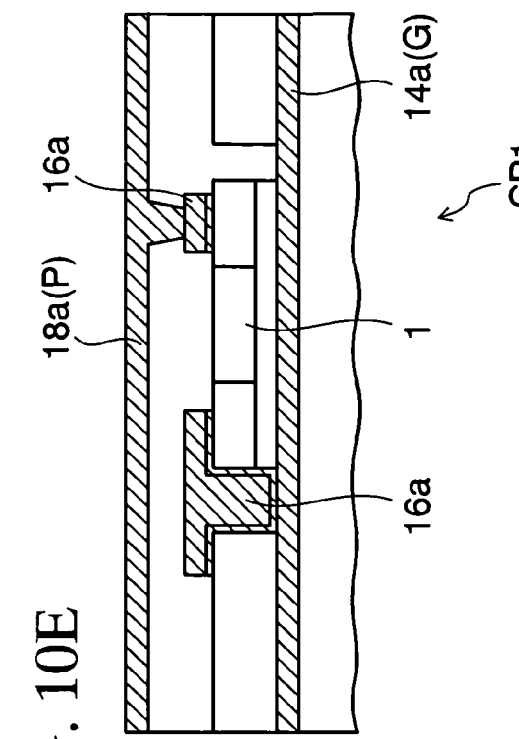
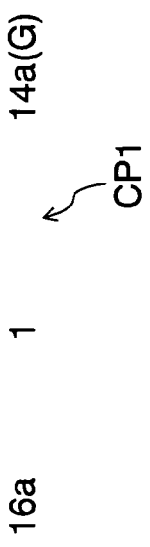
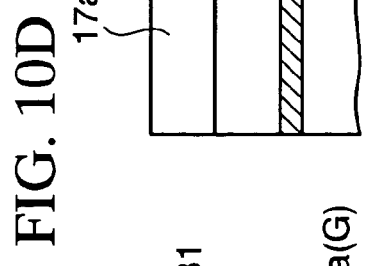
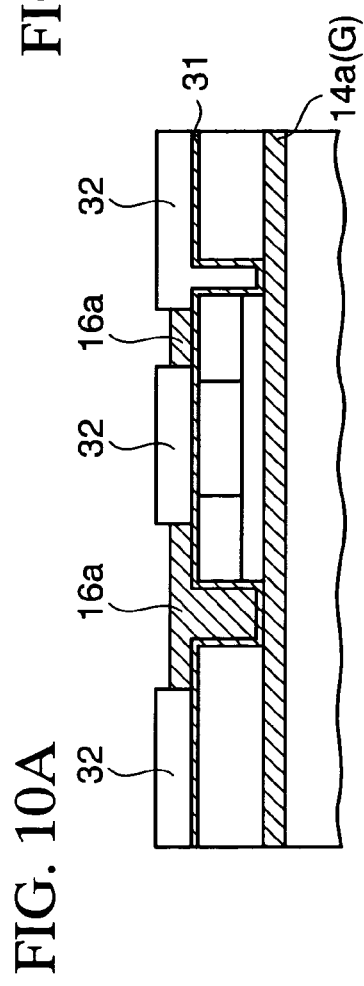
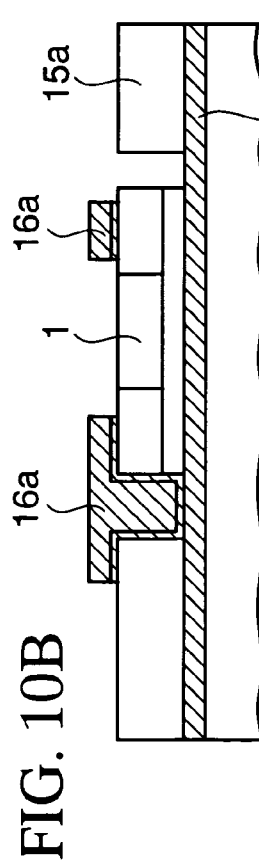
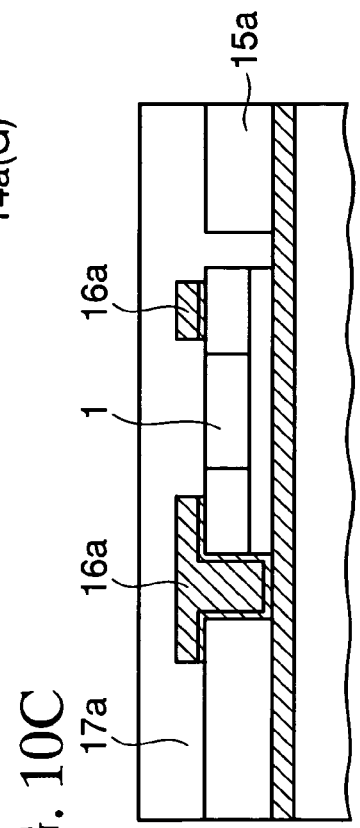

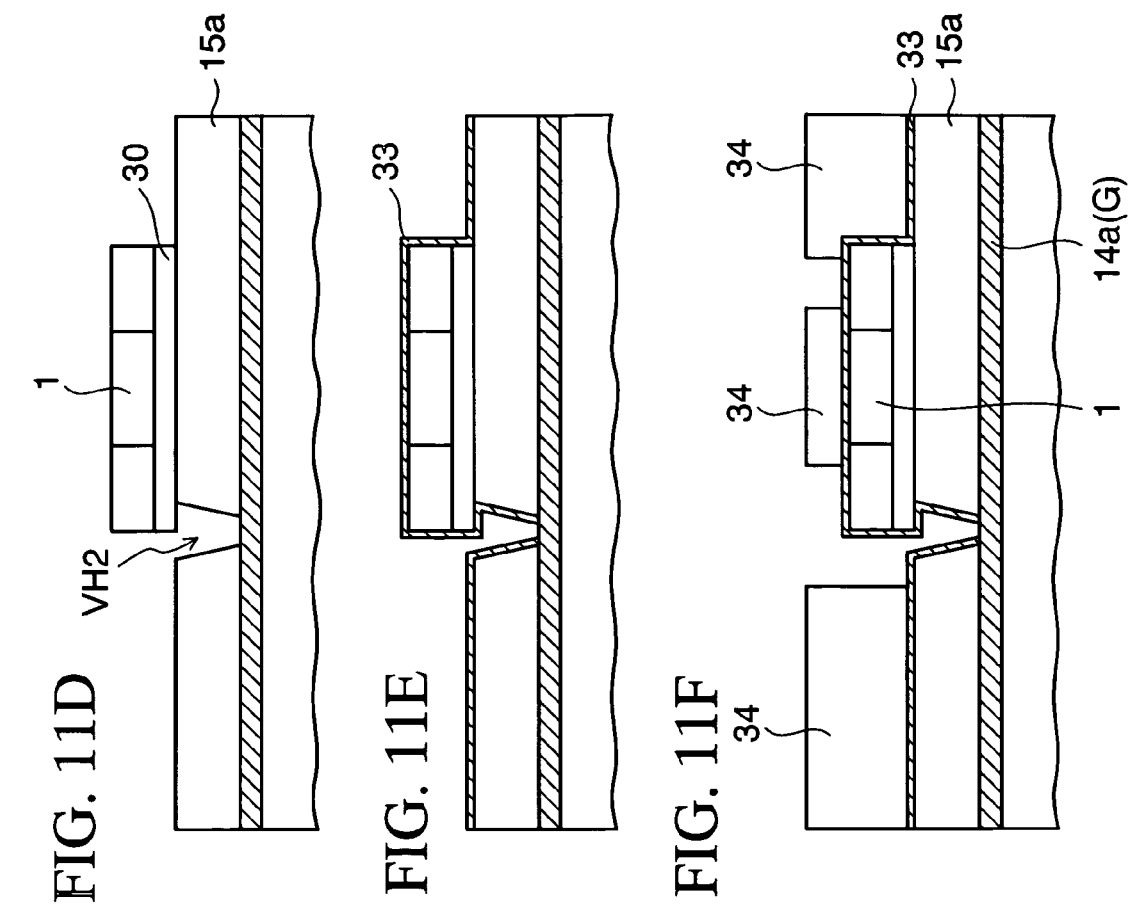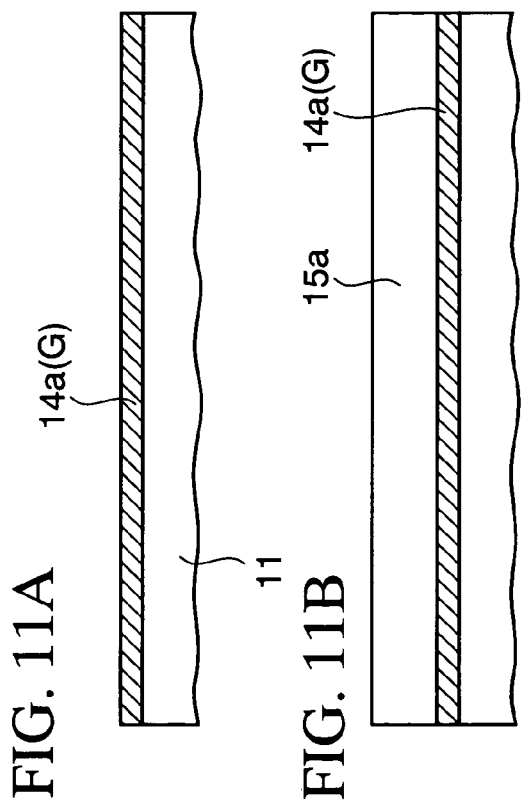

WIRING BOARD MOUNTING A CAPACITOR

CROSS-REFERENCE TO RELATED APPLICATIONS

This application is based on and claims priority of Japanese Patent Application No. 2004-104660 filed on Mar. 31, 2004, the entire contents of which are incorporated herein by reference.

BACKGROUND OF THE INVENTION (a) Field of the Invention

The present invention relates to a wiring board in which a capacitor is mounted. More particularly, the present invention relates to a novel structure of a wiring board in which a decoupling capacitor is mounted, for mounting a semiconductor element (chip), an electronic component, or the like, required to perform a high-speed switching operation, and to a method of manufacturing the same.

In this specification, for convenience, a wiring board is also referred to as a "semiconductor package" in the sense that it plays a role as a package on which a semiconductor element or the like is mounted. Further, a wiring board (semiconductor package) in a state of having a semiconductor element or the like mounted thereon is referred to as a "semiconductor device."

(b) Description of the Related Art

In recent years, for printed wiring boards, weight reduction is required, and finer and denser wiring is required in order to mount a ball grid array (BGA), a pin grid array (PGA), a chip size package (CSP), or the like, which have been miniaturized and come to have a large number of pins. However, since conventional printed wiring boards have needed large areas for the formation of via holes, flexibility in design has been limited, and finer wiring has been difficult to realize. In view of this background, the commercialization of printed wiring boards (build-up multilayer wiring boards) by build-up processes has been recently advanced. As the build-up multilayer wiring boards, various types can be fabricated depending on a combination of material for an interlayer insulating layer and a via hole formation process. In a basic process thereof, conductor layers are stacked by sequentially repeating the formation of an insulating layer, the formation of via holes for interlayer connection in the insulating layer, and the formation of a conductor layer (patterned interconnections, pads, and the like) including the insides of the via holes. In a multilayer wiring board obtained by such a build-up process, even a semiconductor element (chip) having an advanced integration degree and the like can be mounted.

However, on the other hand, since wiring patterns are close to each other in such a multilayer wiring board (semiconductor package), problems can occur, such as an occurrence of crosstalk noise between the wiring patterns, a fluctuation in the potential of a power supply line or a ground line, and the like. In particular, in a semiconductor package in which a semiconductor element, an electronic component, or the like, required to perform a high-speed switching operation, is mounted, the tendency of crosstalk noise to occur increases as the frequency increases. Further, switching noise occurs due to a switching element turning on and off at high speed, and this makes the potentials of a power supply line and the like ready to fluctuate. This leads to a deterioration in the operational reliability of the mounted semiconductor element or the like, and therefore is not preferable.

In view of this background, in order to stabilize the power supply voltage and reduce switching noises and the like, "decoupling" a power supply line and the like has been heretofore performed by attaching a capacitive element such as a chip capacitor to a semiconductor package in which a semiconductor element is mounted. As a typical technique, there is a method in which a chip capacitor is surface-mounted by soldering or the like on the same surface as or the opposite surface to the surface on which the semiconductor element or the like is mounted, of the semiconductor package.

However, in this case, the total thickness of the package increases by an amount corresponding to the provision of the capacitor on the surface of the semiconductor package. Further, the routing length of interconnections connecting the capacitor and the semiconductor element increases, and this may cause an increase in inductance. Since effective "decoupling" cannot be performed when inductance is large, it is desirable that inductance be as small as possible. To this end, it is desirable that the capacitor be placed as close to the semiconductor element as possible. Further, placing the capacitor close to the semiconductor element as described above has been regarded as a technical common sense.

Technologies relating to the above-described conventional technology include, for example, as described in Japanese unexamined Patent Publication (JPP) 11-68319, a technology in which a decoupling capacitor is incorporated into a resin multilayer circuit board obtained by a build-up process and in which a dielectric layer sandwiched between two layers of conductor patterns constituting the capacitor is formed of material (resin) having a relative dielectric constant of a predetermined value or more.

In the conventional technologies as described above, in order to make the inductance of a decoupling capacitor as small as possible, the routing length between the capacitor and a semiconductor element has been made as short as possible by placing the capacitor close to the semiconductor element. In this case, consideration has not been given to the magnetic coupling between a current flowing through the capacitor and a plane-shaped wiring pattern in the vicinity thereof, particularly, a power supply plane or a ground plane.

Accordingly, under the condition that the routing length between the capacitor and the semiconductor element is merely short when the capacitor and the semiconductor element are connected, there may be cases where the equivalent series inductance (ESL) of the capacitor cannot be necessarily reduced. For example, in the case where there is a plane-shaped wiring pattern connected to a long plate-shaped chip capacitor in the vicinity of the capacitor, where the wiring pattern is parallel to the longitudinal direction of the capacitor, and where the direction of a current flowing through the capacitor and that of a current flowing through the wiring pattern are the same, the direction of a magnetic field generated by the current flowing through the capacitor and that of a magnetic field generated by the current flowing through the wiring pattern become the same. Accordingly, as for the ESL of the capacitor, the apparent inductance becomes large under the influence of the magnetic field originating from the wiring pattern.

Namely, there has been a problem in that the ESL of the capacitor cannot be necessarily sufficiently reduced depending on the relationship between the placement of the capacitor and that of a wiring pattern in the vicinity thereof and the relationship between the directions of currents flowing therethrough.

SUMMARY OF THE INVENTION

An object of the present invention is to provide a novel capacitor-mounted wiring board and a method of manufacturing the same in which the equivalent series inductance (ESL) of a mounted capacitor is reduced to allow effective decoupling and, consequently, which can contribute to an improvement in the operational reliability of a semiconductor element or the like to be mounted.

To obtain the above object, according to the present invention, there is provided a capacitor-mounted wiring board which includes a plurality of wiring layers each patterned in a required shape, the plurality of wiring layers being stacked with insulating layers interposed therebetween and connected to each other via conductors formed to pierce the insulating layers in a direction of thickness; and a capacitor mounted such that the capacitor is electrically connected to a wiring layer used as any one of a power supply line and a ground line, in a vicinity of the wiring layer among the plurality of wiring layers, and such that, when a current is passed through the capacitor, a direction of the current and a direction of a current flowing through the wiring layer are reversed.

According to the constitution of the capacitor-mounted wiring board of the present invention, since the capacitor and the wiring layer for power supply (or ground) are placed close to each other, the magnetic coupling between the current flowing through the capacitor and the current flowing through the relevant wiring layer is enhanced. Further, since the directions of the currents thereof are reversed to each other, magnetic fields generated by the currents cancel each other. As a result, the equivalent series inductance (ESL) of the capacitor decreases in appearance under the influence of the magnetic field (magnetic field acting in a direction in which the magnetic field generated by the capacitor is canceled) originating from the relevant wiring layer. Namely, the ESL of the capacitor can be reduced. This makes it possible to perform effective decoupling and can contribute to an improvement in the operational reliability of a semiconductor element or the like to be mounted.

In this case, by further reducing the distance between the capacitor and the relevant wiring layer, the distribution of the current flowing through the capacitor can be concentrated in the vicinity of the relevant wiring layer, which is a target of magnetic coupling. Accordingly, the ESL can be more effectively reduced.

The constitutions of capacitor-mounted wiring boards according to other aspects of the present invention, advantages thereof, and methods of manufacturing the same will be described with reference to detailed embodiments described later.

BRIEF DESCRIPTION OF THE DRAWINGS

FIGS. 10A to 10E are cross-sectional views showing manufacturing steps subsequent to those of FIGS. 9A to 9F;

FIGS. 11A to 11F are cross-sectional views showing manufacturing steps for an essential portion (portion relating to the connection of a chip capacitor) of the capacitor-mounted wiring board according to the embodiment shown in FIG. 8;

DESCRIPTION OF THE PREFERRED EMBODIMENTS

Figure 1:
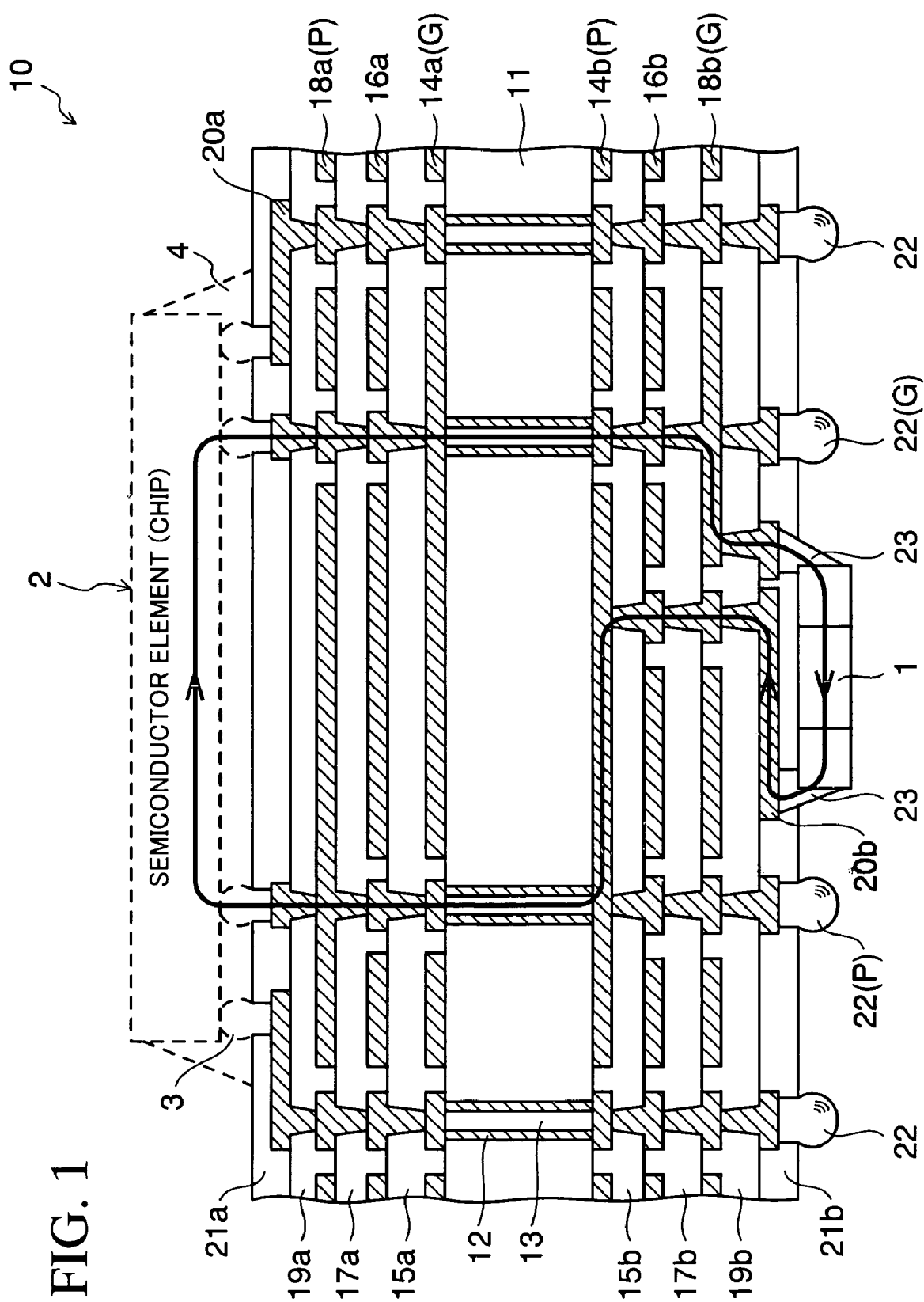
FIG. 1 is a cross-sectional view showing a constitution of a capacitor-mounted wiring board according to a first embodiment of the present invention.

FIG. 1 schematically shows, in a cross-sectional view, a constitution of a capacitor-mounted wiring board (semiconductor package) according to a first embodiment of the present invention. In the illustrated example, there is shown a constitution for the case where a chip capacitor 1 is surface-mounted on the back surface (opposite surface to the surface on which a semiconductor element 2 is to be mounted) of the semiconductor package 10.

In the semiconductor package 10 according to this embodiment, reference numeral 11 denotes an insulating base material (e.g., a glass cloth immersed in thermosetting resin, such as epoxy resin or polyimide resin) as a core substrate of this package; reference numeral 12 denotes a conductor (e.g., metal such as copper (Cu)) formed on the inner wall of a through hole which is formed at a required position in the core substrate 11 to pierce the core substrate 11 in the thickness direction; reference numeral 13 denotes an insulator (e.g., epoxy resin) filled in the conductor 12; reference numerals 14a and 14b denote wiring layers (e.g., Cu) formed on both surfaces of the core substrate 11 and patterned in required shapes, respectively; reference numerals 15a and 15b denote resin layers (e.g., epoxy resin layers) as interlayer insulating layers formed on the core substrate 11 and the wiring layers 14a and 14b, respectively; reference numerals 16a and 16b denote wiring layers formed on the resin layers 15a and 15b and patterned in required shapes to be electrically connected to part of the wiring layers 14a and 14b, respectively; reference numerals 17a and 17b denote resin layers formed on the resin layers 15a and 15b and the wiring layers 16a and 16b, respectively; reference numerals 18a and 18b denote wiring layers formed on the resin layers 17a and 17b and patterned in required shapes to be electrically connected to part of the wiring layers 16a and 16b, respectively; reference numerals 19a and 19b denote resin layers formed on the resin layers 17a and 17b and the wiring layers 18a and 18b, respectively; and reference numerals 20a and 20b denote wiring layers formed on the resin layers 19a and 19b and patterned in required shapes to be electrically connected to part of the wiring layers 18a and 18b, respectively.

Further, reference numerals 21a and 21b denote solder resist layers as protective films which have opening portions at predetermined positions and which are formed on the wiring layers 20a and 20b and the resin layers 19a and 19b, respectively; reference numeral 22 denotes a solder bump as an external connection terminal bonded to each pad portion (part of the wiring layer 20b) exposed from an opening portion of the lower solder resist layer 21b; and reference numeral 23 denotes solder which connects the chip capacitor 1 to two pad portions (part of the wiring layer 20b) similarly exposed from opening portions of the solder-resist layer 21b. Here, it is desirable that a conductor layer formed by nickel (Ni)/gold (Au) plating be deposited on the pad portions (part of the wiring layer 20b) exposed from the opening portions of the solder resist layer in order to improve adhesiveness of solder. This also applies to the pad portions (part of the wiring layer 20a) exposed from the opening portions of the upper solder resist layer 21a.

Incidentally, although the solder bumps (external connection terminals) 22 are provided in the illustrated example, they do not necessarily need to be provided. It is essential only that the pad portions (part of the wiring layer 20b) be exposed from the opening portions of the lower solder resist layer 21b so as to allow the bonding of external connection terminals thereto when necessary. Further, since the chip capacitor 1 is surface-mounted on the package 10, it is desirable that the chip capacitor 1 having a thickness as small as possible be used in order to reduce the total thickness of the package. Moreover, in embodiments in which the chip capacitor 1 is mounted in a buried manner as described later, it is also desirable that the thickness of the chip capacitor 1 be as small as possible, because the chip capacitor 1 is buried in the package. Accordingly, in the embodiments described below, including this embodiment, a thin chip capacitor having a thickness of approximately 100 µm is used as the chip capacitor 1.

When each of the wiring layers 14a, 14b, 16a, 16b, 18a, 18b, 20a, and 20b is formed and patterned in a required shape, the relevant wiring layer is formed to include a signal line, a power supply line (P), or a ground line (G), each of which has a required pattern, and pad portions for interlayer connection. For the wiring layers other than the outermost wiring layers 20a and 20b, the pad portions are formed and patterned to correspond to the positions of top-and-bottom connecting via holes (these via holes are filled with conductor (e.g., Cu)) formed in the corresponding resin layer. On the other hand, the pad portions in each of the outermost wiring layers 20a and 20b are formed and patterned to correspond to the positions of electrodes of the semiconductor element (chip) to be mounted, the bonding positions of the external connection terminals 22, and the mounting position of the chip capacitor 1. Further, in the illustrated example, the wiring layer 18a on the upper side and the wiring layer 14b on the lower side are used as power supply lines, and the wiring layer 14a on the upper side and the wiring layer 18b on the lower side are used as ground lines. In the embodiments described below, including this embodiment, a wiring layer used as a power supply line is also referred to as a "power supply plane", and a wiring layer used as a ground line is also referred to as a "ground plane", for convenience.

The capacitor-mounted wiring board (semiconductor package) 10 according to this embodiment has the following feature: as described later, the chip capacitor 1 mounted for decoupling is mounted in such a manner that the chip capacitor 1 is electrically connected to a power supply plane (in the example of FIG. 1, the lowest wiring layer 20b connected to the wiring layer 14b for power supply through via holes (conductors filled therein)) in the vicinity of the relevant plane, and that, when a current is passed through the chip capacitor 1, the direction (right-to-left direction in the example of FIG. 1) of the current and the direction (left-to-right direction in the example of FIG. 1) of a current flowing through the relevant plane (wiring layer 20b) are reversed to each other. Such a distinctive constitution also applies to other embodiments described later, although there is a difference of whether the relevant plane placed in the vicinity of the chip capacitor 1 is a power supply plane or a ground plane.

The semiconductor package 10 according to this embodiment can be manufactured using a publicly known technology such as a build-up process. Accordingly, although the illustration of steps of a manufacturing method thereof is omitted, a brief description thereof is as follows. For example, where a build-up process is used, first, the wiring layers 14a and 14b having required pattern shapes are formed on both surfaces of the core substrate 11 (in which through holes are formed at required positions and in which the insides thereof are filled with the conductors 12 and the insulators 13). Next, wiring layers are stacked until four layers are formed on each of the upper and lower sides, by sequentially repeating the formation of a resin layer (interlayer insulating layer), the formation of via holes for interlayer connection in the resin layer, and the formation of a wiring layer including the insides of the via holes. Furthermore, after the solder resist layers 21a and 21b are formed to cover the entire surfaces in such a manner that the pad portions of the outermost wiring layers 20a and 20b are exposed, the solder bumps (external connection terminals) 22 are bonded to the pad portions exposed from the solder resist layer 21b on the board-mounted side, and the chip capacitor 1 is surface-mounted by soldering (23), thus obtaining the semiconductor package 10 (FIG. 1) of this embodiment.

Further, where the semiconductor element (chip) 2 is mounted on this package 10 to obtain a semiconductor device, for example, the relevant chip 2 is connected to the package 10 by flip-chip technology in such a manner that electrodes 3 (e.g., solder bumps) bonded to the tops of pads of the semiconductor chip 2 are electrically connected to the pad portions (part of the wiring layer 20a) exposed from the opening portions of the upper solder resist layer 21a, and furthermore, underfill resin 4 is filled in the space between the semiconductor chip 2 and the solder resist layer 21a and cured, thereby bonding the semiconductor chip to the package 10. Alternatively, instead of the underfill resin 4, non-conductive paste (NCP) may be applied thereto or non-conductive film (NCF) may be attached thereto in advance so that the non-conductive paste or film is formed into a shape equivalent to that of the underfill resin 4 simultaneously with flip-chip bonding.

According to the constitution of the semiconductor package 10 (FIG. 1) of this embodiment, since the chip capacitor 1 and a power supply plane (wiring layer 20b) are placed close to each other and the direction of the current flowing through the relevant capacitor 1 and the direction of the current flowing through the relevant plane are reversed to each other, the magnetic coupling between the currents thereof is enhanced, and magnetic fields generated by the currents cancel each other. As a result, the ESL of the chip capacitor 1 decreases in appearance under the influence of a magnetic field (i.e., a magnetic field acting in a direction in which the magnetic field generated by the capacitor 1 is canceled) originating from the relevant power supply plane (wiring layer 20b). Namely, the ESL of the chip capacitor 1 can be reduced, and this makes it possible to perform effective decoupling and can contribute to an improvement in the operational reliability of the semiconductor element (chip) 2 to be mounted.

Figure 2:
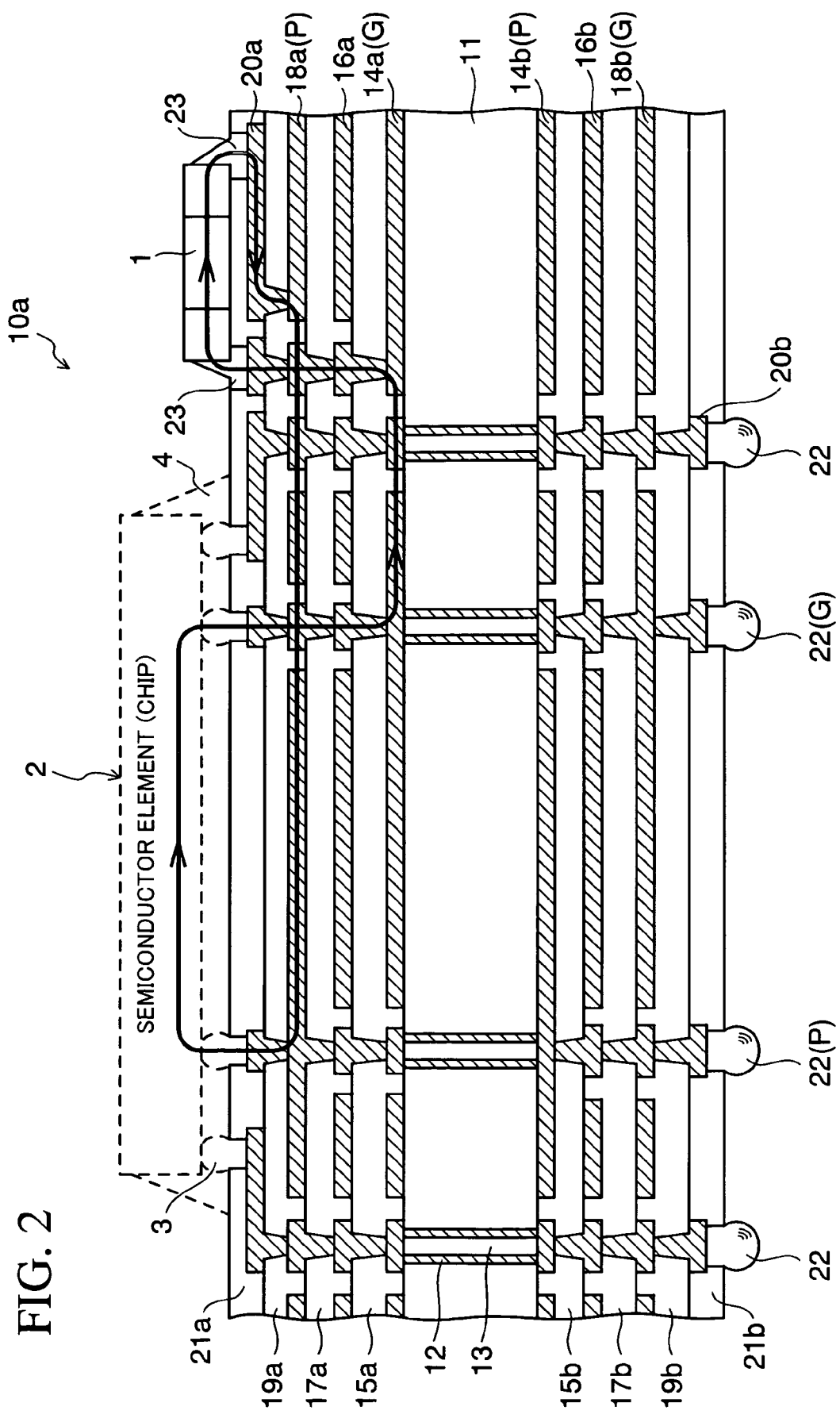
FIG. 2 is a cross-sectional view showing a constitution of a capacitor-mounted wiring board according to a second embodiment of the present invention.

FIG. 2 schematically shows, in a cross-sectional view, a constitution of a capacitor-mounted wiring board (semiconductor package) according to a second embodiment of the present invention.

The semiconductor package 10a according to this embodiment differs from the semiconductor package 10 (FIG. 1) according to the aforementioned first embodiment, in that the chip capacitor 1 is surface-mounted in a region (right side in the illustrated example) around a semiconductor element mount region on the top surface (the same surface as the surface on which the semiconductor element 2 is to be mounted) of this package 10a. Other constitutions and the functions thereof are basically the same as those in the case of the first embodiment, and thus the explanation thereof is omitted.

According to this second embodiment, electrical characteristics for the entire semiconductor device (semiconductor package 10a in a state of having the semiconductor element 2 mounted thereon) can be further improved compared with the case of the first embodiment, because the chip capacitor 1 is mounted closer to the semiconductor element 2 to be mounted, without through holes having large inductances.

Figure 3:
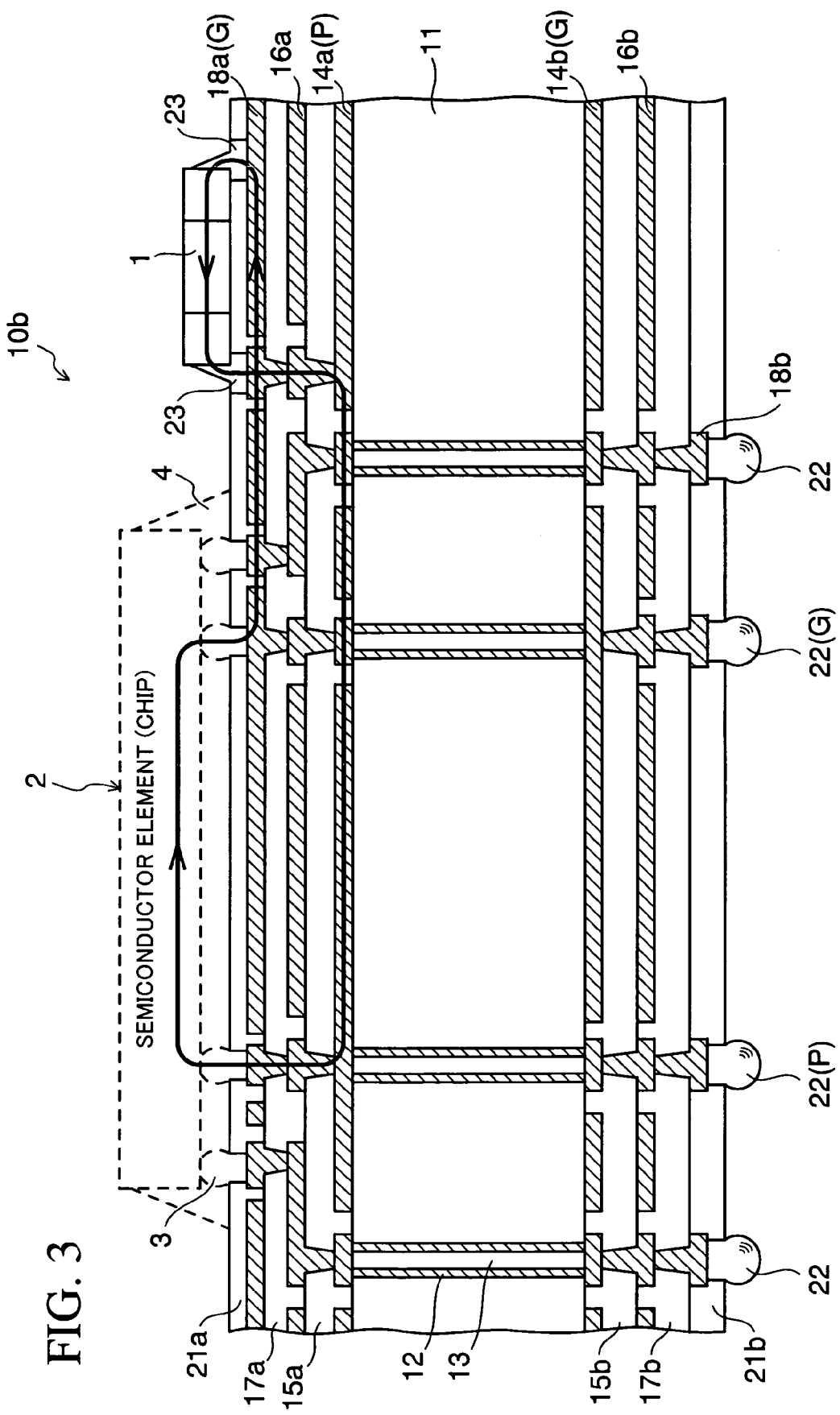
FIG. 3 is a cross-sectional view showing a constitution of a capacitor-mounted wiring board according to a third embodiment of the present invention.

FIG. 3 schematically shows, in a cross-sectional view, a constitution of a capacitor-mounted wiring board (semiconductor package) according to a third embodiment of the present invention.

The semiconductor package 10b according to this embodiment differs from the semiconductor package 10a (FIG. 2) according to the aforementioned second embodiment, in that a ground plane (i.e., a ground wiring layer 18a having a current flowing therethrough to generate a magnetic field in a direction in which the magnetic field generated by the current flowing through the capacitor 1 is canceled) is placed directly under the chip capacitor 1. This difference in arrangement reduces the number (length) of layers of via holes existing in the path of the current flowing through the capacitor 1 compared with the case of the second embodiment, and decreases inductance generated in the path of the current flowing through the capacitor. Accordingly, electrical characteristics for the entire semiconductor device (semiconductor package 10b in a state of having the semiconductor element 2 mounted thereon) are improved. Other constitutions and the functions thereof are basically the same as those in the case of the second embodiment, and thus the explanation thereof is omitted.

In the example of FIG. 3, the wiring layer 18a directly under the chip capacitor 1 is used for ground. However, it also applies to the case where the wiring layer 18a is used for power supply (power supply plane). In this case, the wiring layer 14a used for power supply is changed to use for ground, and the pattern of this wiring layer 14a is changed so as to be connected to the external connection terminal 22 (G) for ground. On the other hand, the pattern of the wiring layer 18a is changed so as to be connected to the external connection terminal 22 (P) for power supply.

According to this third embodiment, the coupling between the magnetic field generated by the current flowing through the capacitor 1 and the magnetic field generated by the current flowing through the relevant plane (wiring layer 18a) is further enhanced compared with the case of the second embodiment, because a ground plane (or a power supply plane) is placed directly under the chip capacitor 1. As a result, the ESL of the chip capacitor 1 can be more effectively reduced.

Figure 4:
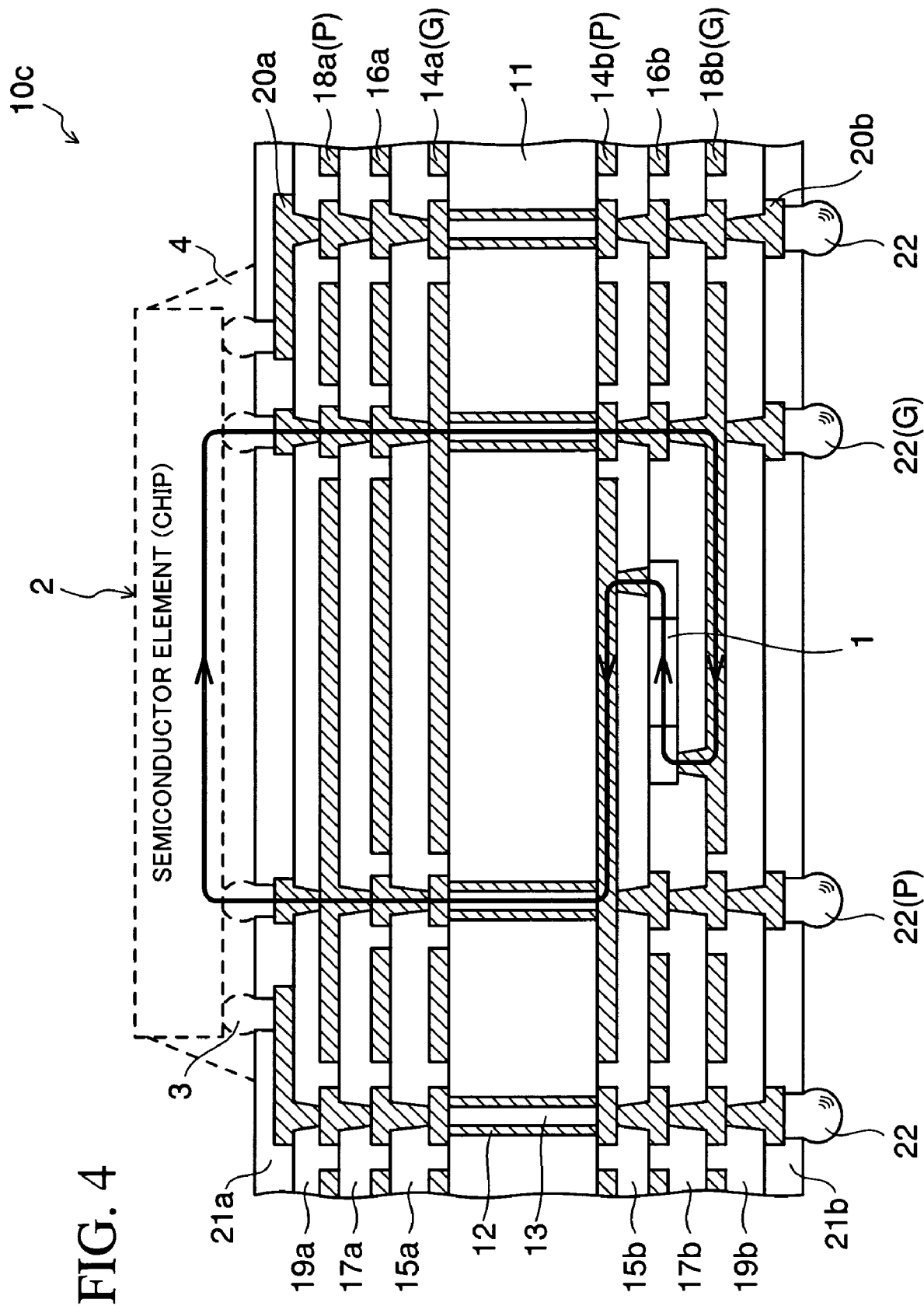
FIG. 4 is a cross-sectional view showing a constitution of a capacitor-mounted wiring board according to a fourth embodiment of the present invention.

FIG. 4 schematically shows, in a cross-sectional view, a constitution of a capacitor-mounted wiring board (semiconductor package) according to a fourth embodiment of the present invention. In the illustrated example, there is shown a constitution for the case where the chip capacitor 1 is mounted in a buried manner in the semiconductor package 10c.

The semiconductor package 10c according to this embodiment differs from the semiconductor package 10 (FIG. 1) according to the aforementioned first embodiment, in that the chip capacitor 1 is buried in, of the build-up layers constituting this package, a build-up layer (resin layer 17b) stacked on the lower side (opposite side to the side on which the semiconductor element 2 is to be mounted) of the core substrate 11. One electrode of the chip capacitor 1 is connected to the power supply wiring layer 14b via the conductor (part of the wiring layer 16b) filled in the via hole formed to pierce the resin layer 15b in the thickness direction, and the other electrode thereof is connected to the ground wiring layer 18b via the conductor (part of the wiring layer 18b) filled in the via hole formed to pierce the resin layer 17b in the thickness direction. Other constitutions and the functions thereof are basically the same as those in the case of the first embodiment, and thus the explanation thereof is omitted.

According to this fourth embodiment, countercurrents (currents flowing through the planes 14b and 18b) for the current flowing through the chip capacitor 1 relatively increases compared with the case where the chip capacitor 1 is surface-mounted as in the aforementioned embodiments (FIGS. 1 to 3) (i.e., a power supply plane (e.g., the wiring layer 20b in FIG. 1) or a ground plane (e.g., the wiring layer 18a in FIG. 3) is placed only on one side of the chip capacitor 1). This is because the chip capacitor 1 is sandwiched between a power supply plane (wiring layer 14b) and a ground plane (wiring layer 18b). As a result, the ESL of the chip capacitor 1 can be more effectively reduced.

Moreover, since the chip capacitor 1 is mounted in a buried manner in the semiconductor package 10c, the total thickness of the semiconductor package 10c can be reduced compared with the cases of the first to third embodiments (FIGS. 1 to 3). Furthermore, since the chip capacitor 1 is buried in a region under the semiconductor element mount region, the size of the semiconductor package 10c can be reduced compared with the case where the chip capacitor 1 is surface-mounted on a region around the semiconductor element mount region as in the second and third embodiments (FIGS. 2 and 3).

Figure 5:
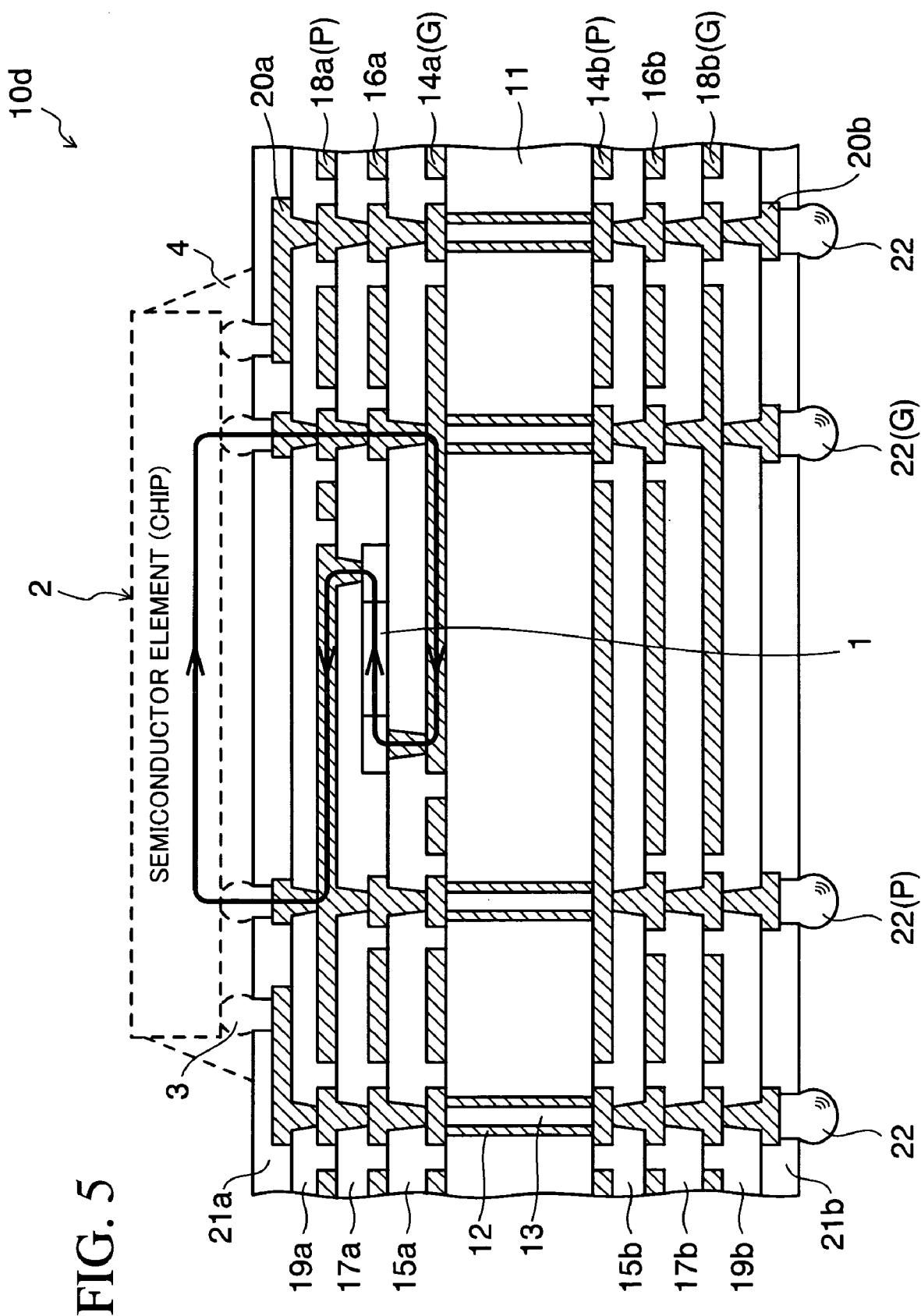
FIG. 5 is a cross-sectional view showing a constitution of a capacitor-mounted wiring board according to a fifth embodiment of the present invention.

FIG. 5 schematically shows, in a cross-sectional view, a constitution of a capacitor-mounted wiring board (semiconductor package) according to a fifth embodiment of the present invention.

The semiconductor package 10d according to this embodiment differs from the semiconductor package 10c (FIG. 4) according to the aforementioned fourth embodiment, in that the chip capacitor 1 is buried in, of the build-up layers constituting this package, a build-up layer (resin layer 17a) stacked on the upper side (the same side as the side on which the semiconductor element 2 is to be mounted) of the core substrate 11. One electrode of the chip capacitor 1 is connected to the power wiring layer 18a via the conductor (part of the wiring layer 18a) filled in the via hole formed to pierce the resin layer 17a in the thickness direction, and the other electrode thereof is connected to the ground wiring layer 14a via the conductor (part of the wiring layer 16a) filled in the via hole formed to pierce the resin layer 15a in the thickness direction. Other constitutions and the functions thereof are basically the same as those in the case of the fourth embodiment, and thus the explanation thereof is omitted.

According to this fifth embodiment, electrical characteristics for the entire semiconductor device (semiconductor package 10d in a state of having the semiconductor element 2 mounted thereon) can be further improved compared with the case of the fourth embodiment, because the chip capacitor 1 is mounted in a buried manner closer to the semiconductor element 2 to be mounted, without through holes having large inductances.

Figure 6:
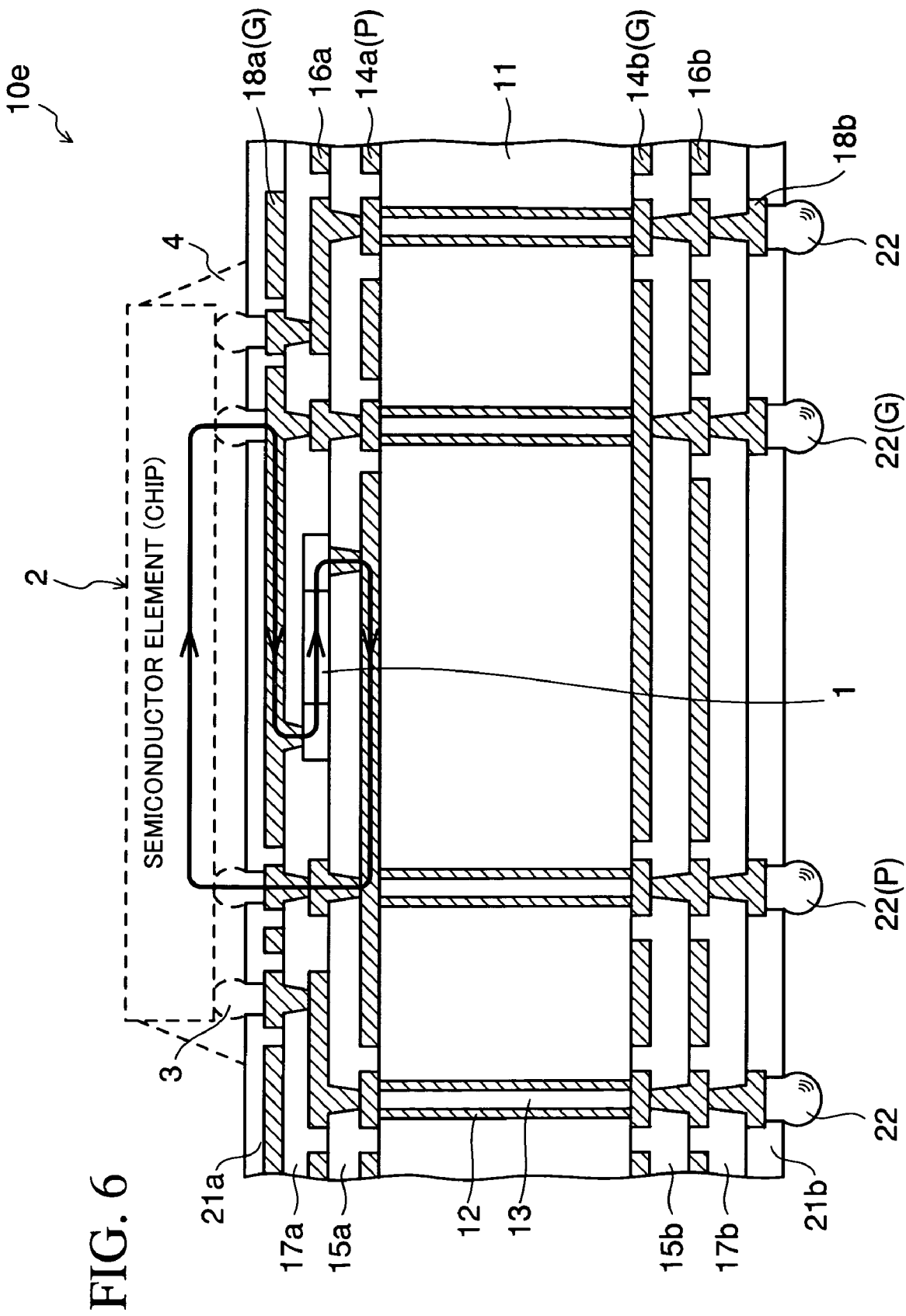
FIG. 6 is a cross-sectional view showing a constitution of a capacitor-mounted wiring board according to a sixth embodiment of the present invention.

FIG. 6 schematically shows, in a cross-sectional view, a constitution of a capacitor-mounted wiring board (semiconductor package) according to a sixth embodiment of the present invention.

The semiconductor package 10e according to this embodiment differs from the semiconductor package 10d (FIG. 5) according to the aforementioned fifth embodiment, in that a ground plane (ground wiring layer 18a) is placed directly under the semiconductor element 2 to be mounted. This difference in arrangement reduces the number (length) of layers of via holes existing in the path of the current flowing through the capacitor 1 compared with the case of the fifth embodiment, and decreases inductance generated in the path of the current flowing through the capacitor. Accordingly, electrical characteristics for the entire semiconductor device (semiconductor package 10e in a state of having the semiconductor element 2 mounted thereon) are improved. Further, one electrode of the chip capacitor 1 is connected to the ground wiring layer 18a via the conductor (part of the wiring layer 18a) filled in the via hole formed to pierce the resin layer 17a in the thickness direction, and the other electrode thereof is connected to the power supply wiring layer 14a via the conductor (part of the wiring layer 16a) filled in the via hole formed to pierce the resin layer 15a in the thickness direction. Other constitutions and the functions thereof are basically the same as those in the case of the fifth embodiment, and thus the explanation thereof is omitted.

In the example of FIG. 6, the wiring layer 18a directly under the semiconductor element 2 to be mounted is used for ground. However, this also applies to the case where the wiring layer 18a is used for power supply (power supply plane). In this case, the wiring layer 14a used for power supply is changed to be used for ground, and the pattern of this wiring layer 14a is changed so as to be connected to the external connection terminal 22(G) for ground. On the other hand, the pattern of the wiring layer 18a is changed so as to be connected to the external connection terminal 22(P) for power supply.

Figure 7:
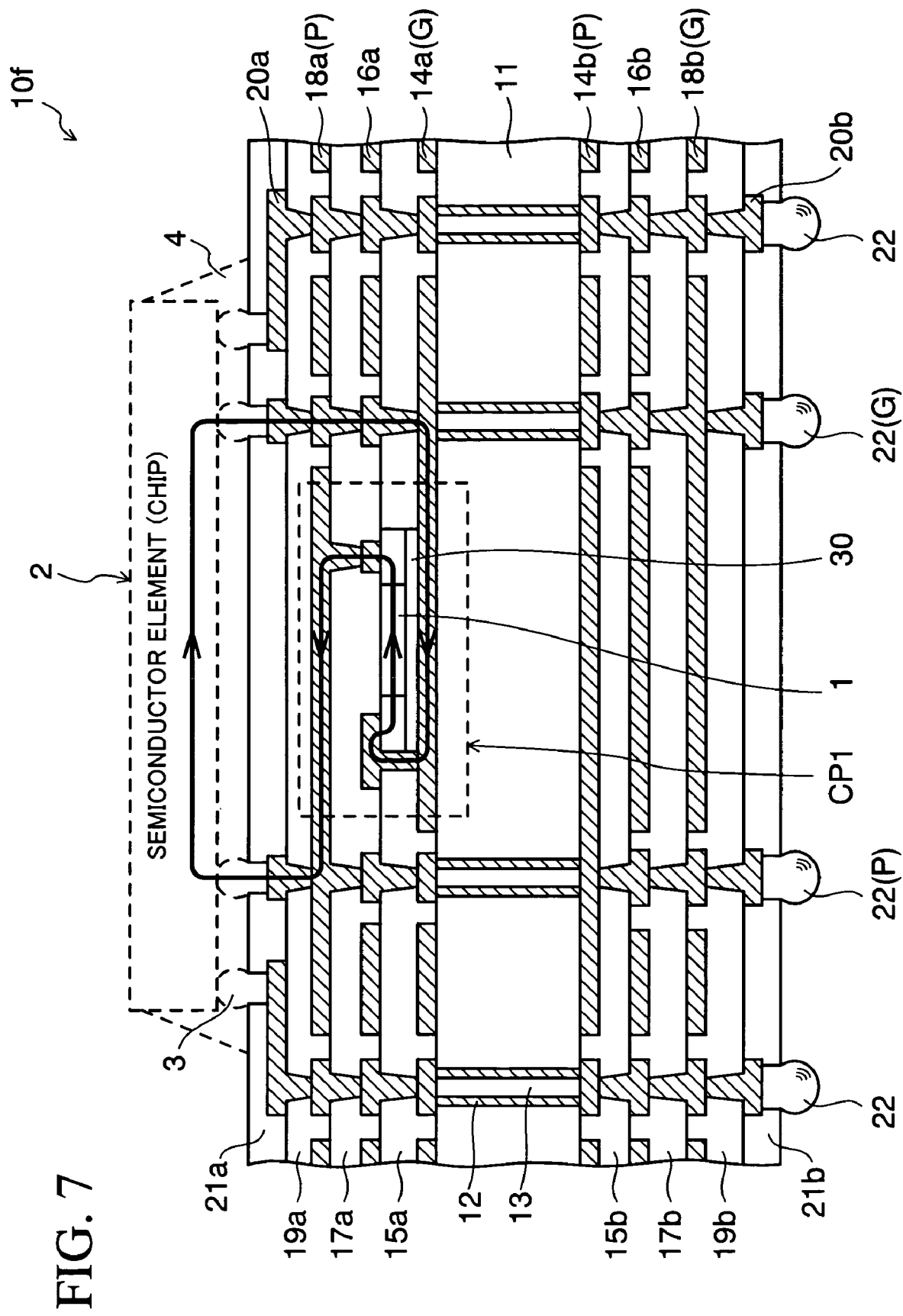
FIG. 7 is a cross-sectional view showing a constitution of a capacitor-mounted wiring board according to a seventh embodiment of the present invention.

FIG. 7 schematically shows, in a cross-sectional view, a constitution of a capacitor-mounted wiring board (semiconductor package) according to a seventh embodiment of the present invention.

The semiconductor package 10f according to this embodiment differs from the semiconductor package 10d (FIG. 5) according to the aforementioned fifth embodiment in the connection mode of the chip capacitor 1. Namely, as shown in the portion CP1 surrounded by a dashed-line in the package 10f in FIG. 7, the chip capacitor 1 is mounted on the ground wiring layer 14a with an adhesive 30 interposed therebetween, and (at least an end portion of) one electrode of the chip capacitor 1 is engaged with and connected to the wiring layer 16a (this is connected to the wiring layer 14a) which is formed to be approximately L-shaped when viewed in a cross section. Further, the other electrode of the chip capacitor 1 is connected to the power supply wiring layer 18a via another part of the wiring layer 16a and the conductor (part of the wiring layer 18a) filled in the via hole formed to pierce the resin layer 17a in the thickness direction. Other constitutions and the functions thereof are basically the same as those in the case of the fifth embodiment, and thus the explanation thereof is omitted.

This seventh embodiment has effects similar to those of the fifth embodiment because the package structure according to the seventh embodiment is basically equivalent to that according to the fifth embodiment. Furthermore, based on the above-described constitutional feature (one electrode of the chip capacitor 1 is engaged with the approximately L-shaped wiring layer 16a), the reliability of the electrical connection between the relevant electrode and the ground plane (wiring layer 14a) can be improved.

Figure 8:
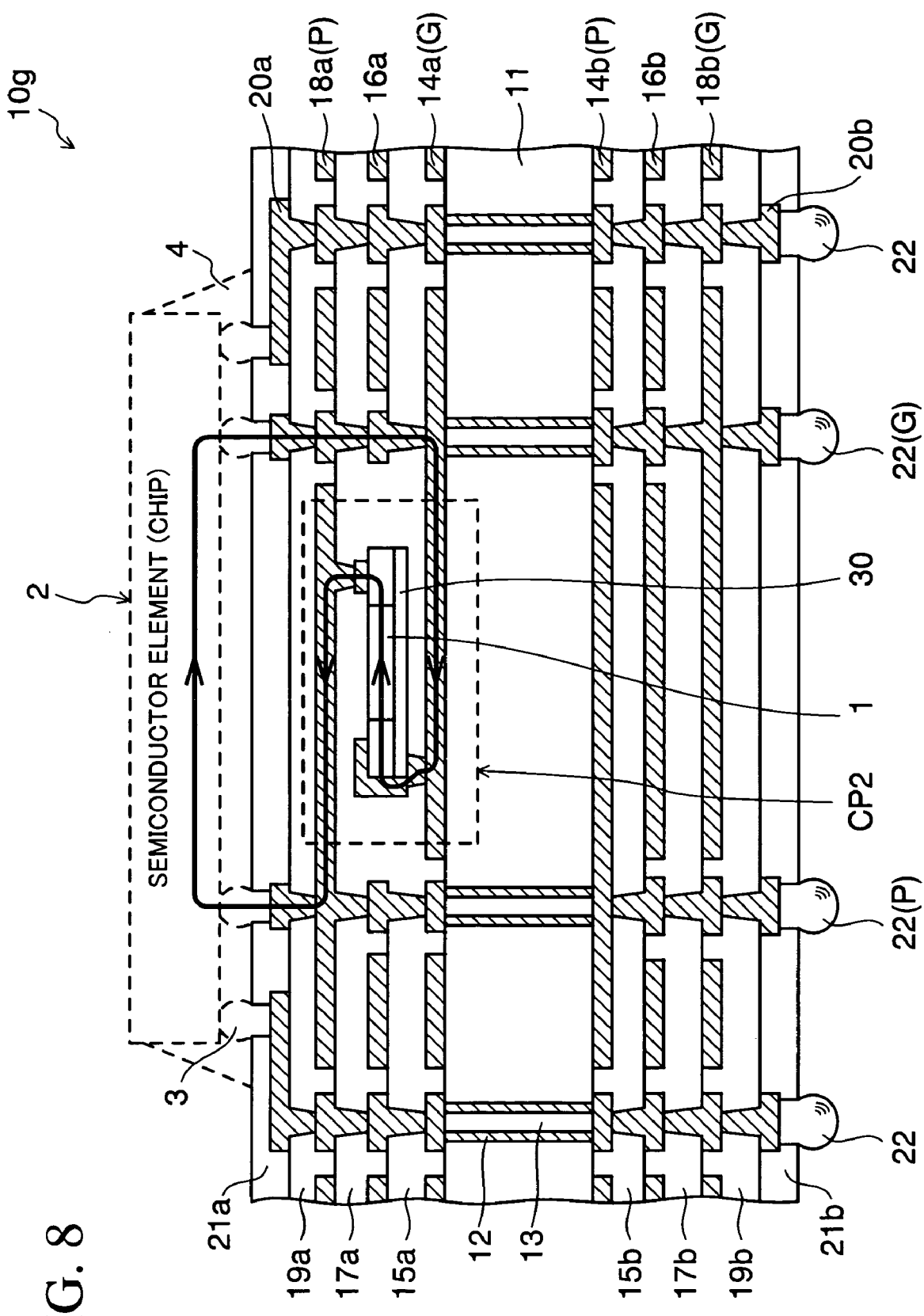
FIG. 8 is a cross-sectional view showing a constitution of a capacitor-mounted wiring board according to an eighth embodiment of the present invention.

FIG. 8 schematically shows, in a cross-sectional view, a constitution of a capacitor-mounted wiring board (semiconductor package) according to an eighth embodiment of the present invention.

The semiconductor package 10g according to this embodiment differs from the semiconductor package 10d (FIG. 5) according to the aforementioned fifth embodiment in the connection mode of the chip capacitor 1. Namely, as shown in the portion CP2 surrounded by a dashed-line in the package log in FIG. 8, the chip capacitor 1 is mounted in the resin layer 15a with the adhesive 30 interposed therebetween, and (at least an end portion of) one electrode of the chip capacitor 1 is engaged with and connected to the wiring layer 16a (this is connected to the ground wiring layer 14a via the conductor (part of the wiring layer 16a) filled in the via hole formed to pierce the resin layer 15a in the thickness direction) which is formed to be approximately L-shaped when viewed in a cross section. Further, the other electrode of the chip capacitor 1 is connected to the power supply wiring layer 18a via another part of the wiring layer 16a and the conductor (part of the wiring layer 18a) filled in the via hole formed to pierce the resin layer 17a in the thickness direction. Other constitutions and the functions thereof are basically the same as those in the case of the fifth embodiment, and thus the explanation thereof is omitted.

This eighth embodiment also has effects similar to those of the fifth embodiment because the package structure according to the eighth embodiment is basically equivalent to that according to the fifth embodiment. Furthermore, based on the above-described constitutional feature (one electrode of the chip capacitor 1 is engaged with the L-shaped wiring layer 16a), the reliability of the electrical connection between the relevant electrode and the ground plane (wiring layer 14a) can be improved as in the case of the seventh embodiment.

Incidentally, for each of the semiconductor packages 10f and 10g (FIGS. 7 and 8) according to the seventh and eighth embodiments, the description has been made by taking as an example the case where the portion CP1 or CP2 relating to the connection mode of the chip capacitor 1 is replaced in the semiconductor package 10d (FIG. 5) according to the fifth embodiment. It is a matter of course that the similar replacement can be performed in the semiconductor package 10c (FIG. 4) according to the fourth embodiment or the semiconductor package 10e (FIG. 6) according to the sixth embodiment.

Further, the semiconductor packages 10f and 10g (FIGS. 7 and 8) according to the seventh and eighth embodiments can be manufactured by a build-up process known to those skilled in the art, except for the portions CP1 and CP2 relating to the connection mode of the chip capacitor 1. Accordingly, an explanation of portions except the relevant portions CP1 and CP2 will be omitted for simplification of description, and manufacturing steps only for the relevant portions CP1 and CP2 will be described with reference to FIGS. 9A to 12E below.

<Manufacturing steps for the relevant portion CP1 according to the seventh embodiment: see FIGS. 9A to 10E>

To begin with, in the first step (FIG. 9A), a ground plane (wiring layer 14a) is formed on the core substrate 11. This wiring layer 14a is formed on the entire upper surface of the core substrate 11 in the illustrated example, but is formed in a required pattern shape as shown in FIG. 7. For example, a thin film of copper (Cu) is formed on the core substrate 11, and a required pattern is formed by a subtractive method using the thin film as a seed.

In the next step (FIG. 9B), the resin layer 15a as an interlayer insulating layer is formed on the patterned wiring layer 14a. For example, thermosetting resin, such as epoxy resin or polyimide resin, is laminated on the wiring layer 14a, planarized, pressed, and cured, thus forming the resin layer 15a.

In the next step (FIG. 9C), a recessed portion (cavity) RP is formed by routing at a specific position (a position corresponding to a portion at which a chip capacitor is to be mounted as described later) in the resin layer 15a. Instead of the routing, the recessed portion RP may be formed by sandblasting, etching, or the like.

In the next step (FIG. 9D), the thin chip capacitor 1 having a thickness of approximately 100 µm is mounted on the wiring layer 14a in the recessed portion (cavity) RP formed in the resin layer 15a. In this case, after the adhesive 30 is attached to the wiring layer 14a, the capacitor 1 may be mounted in accordance with the position of the adhesive 30. Alternatively, after the adhesive 30 is attached to the capacitor 1, the capacitor 1 having the adhesive 30 attached thereto may be mounted on the wiring layer 14a. When the chip capacitor 1 is mounted, positioning is performed so that a clearance on one side (left side in the illustrated example) is relatively larger in the recessed portion RP. In this embodiment, the clearance on the left side is selected to be approximately 100 µm to 200 µm. At this time, the clearance on the right side is selected to be approximately 50 µm to 200 µm.

In the next step (FIG. 9E), a seed layer 31 having a thickness of approximately 1 µm, which serves as a plating base film during electrolytic plating performed in a later step, is formed on the entire surface by electroless Cu plating. Instead of the electroless plating, the seed layer 31 may be formed by sputtering.

In the next step (FIG. 9F), plating resist (resist layer 32) is formed to cover the entire surface in such a manner that specific portions of the wiring layer 14a, the resin layer 15a and the chip capacitor 1, which are covered with the seed layer 31, are exposed. The "specific portions" correspond to the portions corresponding to the position of one electrode (left electrode in the illustrated example) of the chip capacitor 1 and the position of the wiring layer 14a existing on the same side, and the portion corresponding to the position of another electrode (right electrode in the illustrated example) of the chip capacitor 1. For the formation of the resist layer 32, for example, a photosensitive dry film (approximately 25 µm in thickness) is laminated on the entire surface, and exposure and development (patterning of the dry film) are performed in accordance with the shapes of the above-described "specific portions," whereby openings are formed in the dry film in the portions corresponding to the regions of the specific portions. Thus, the resist layer 32 from which the specific portions are exposed are formed.

In the next step (FIG. 10A), the top of the seed layer 31 exposed from the resist layer 32 is electrolytically plated with Cu using the seed layer as a power-supplying layer, so as to form the wiring layer 16a. Thus, the wiring layer 16a is formed on both electrodes of the chip capacitor 1, and the wiring layer 16a on one side is connected to the ground plane (wiring layer 14a) via the seed layer 31 at this time.

In the next step (FIG. 10B), the dry film 32 is stripped off and removed. Furthermore, the exposed portion of the seed layer 31 (Cu) is removed by wet etching.

Figure 9A:
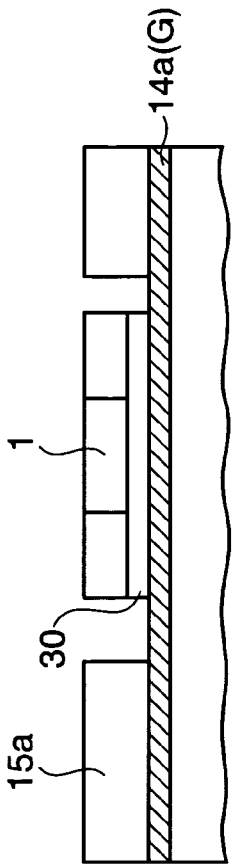
FIGS. 9A to 9F are cross-sectional views showing manufacturing steps for an essential portion (portion relating to the connection of a chip capacitor) of the capacitor-mounted wiring board according to the embodiment shown in FIG. 7.
Figure 9B:
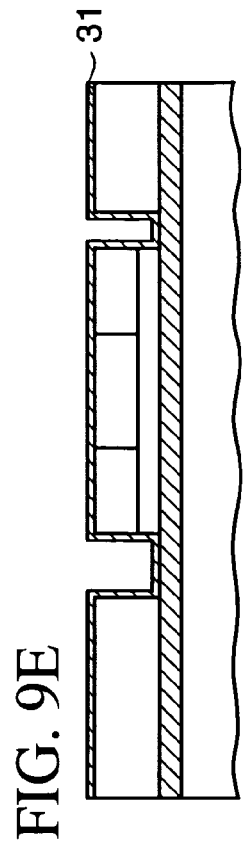
Figure 9C:
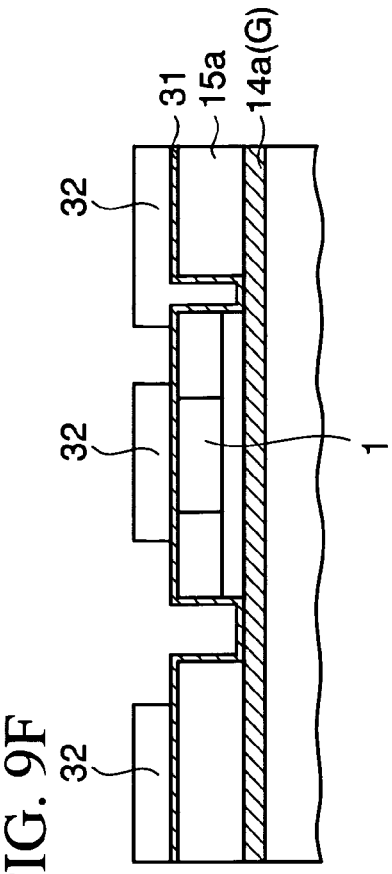
Figure 9D:
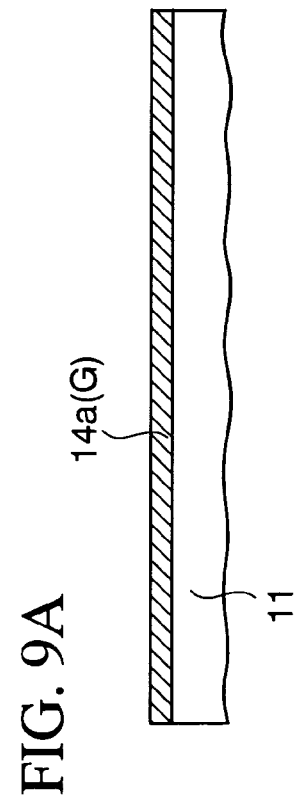

In the next step (FIG. 10C), the resin layer 17a as an interlayer insulating layer is formed on the resin layer 15a, the wiring layers 14a and 16a, and the chip capacitor 1, as in the process performed in the step of FIG. 9B.

In the next step (FIG. 10D), a via hole VH1 is formed at a specific position (a position corresponding to the portion at which the wiring layer 16a on the other electrode of the chip capacitor 1 is formed) in the resin layer 17a, so as to reach the relevant wiring layer 16a. For example, the via hole VH1 is formed by removing the corresponding portion of the resin layer 17a using a $CO_2$ laser, a UV-YAG laser, or the like.

In the final step (FIG. 10E), the surface of the resin layer 17a, including the inside of the via hole VH1, is electrolytically plated with Cu using the wiring layer 16a as a power-supplying layer, and a power supply plane (wiring layer 18a) having a required pattern shape is formed by a semi-additive method. Thus, the other electrode of the chip capacitor 1 is connected to the power supply plane (wiring layer 18a) via the wiring layer 16a (including the seed layer), and the portion CP1 relating to the connection mode of the chip capacitor 1 is fabricated.

<Manufacturing steps for the relevant portion CP2 according to the eighth embodiment: see FIGS. 11A to 12E>

To begin with, in the first step (FIG. 11A), a ground plane (wiring layer 14a) is formed on the core substrate 11 as in the process performed in the step of FIG. 9A.

In the next step (FIG. 11B), the resin layer 15a as an interlayer insulating layer is formed on the patterned wiring layer 14a as in the process performed in the step of FIG. 9B.

In the next step (FIG. 1C), a via hole VH2 is formed at a specific position (position corresponding to the portion in which an end portion of one electrode of the chip capacitor 1 is located) in the resin layer 15a, so as to reach the wiring layer 14a. For example, the via hole VH2 is formed by removing the corresponding portion of the resin layer 15a using a $CO_2$ laser, a UV-YAG laser, or the like.

In the next step (FIG. 11D), the capacitor 1 is mounted in such a manner that one electrode of the chip capacitor 1 partially covers the opening region of the via hole VH2 formed in the resin layer 15a. In this case, after the adhesive 30 is attached to the resin layer 15a, the capacitor 1 may be mounted in accordance with the position of the adhesive 30. Alternatively, after the adhesive 30 is attached to the capacitor 1, the capacitor 1 having the adhesive 30 attached thereto may be mounted on the resin layer 15a.

Figure 9E:
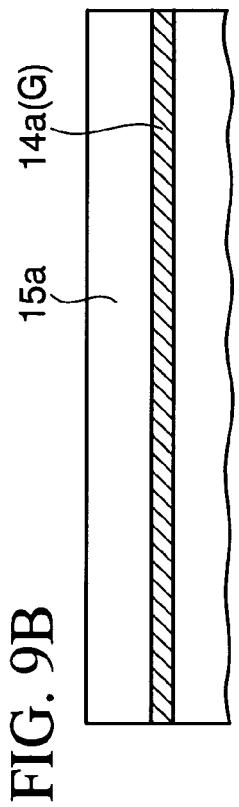
Figure 9F:
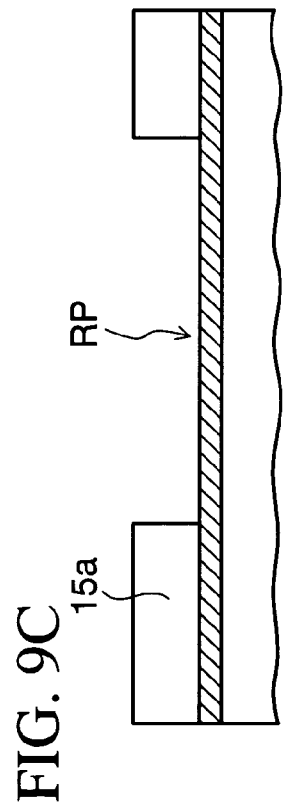
Figure 12A:
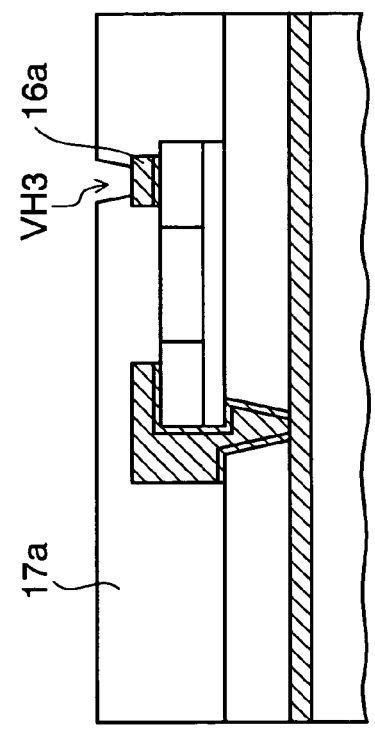
FIGS. 12A to 12E are cross-sectional views showing manufacturing steps subsequent to those of FIGS. 11A to 11F.
Figure 12D:
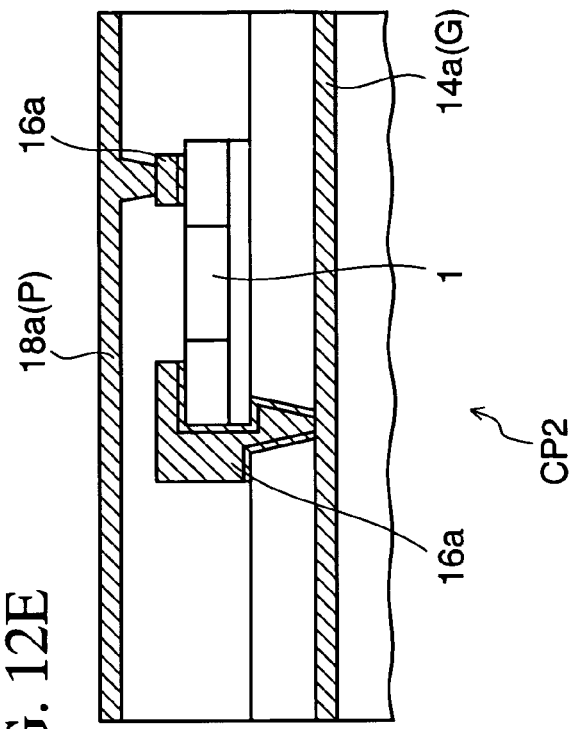
Figure 12B:
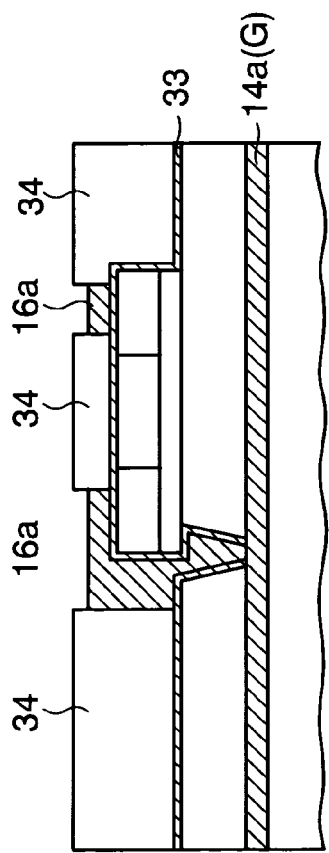
Figure 12C:
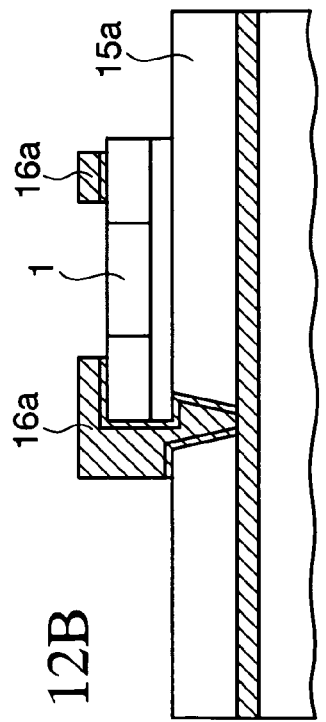
Figure 12E:
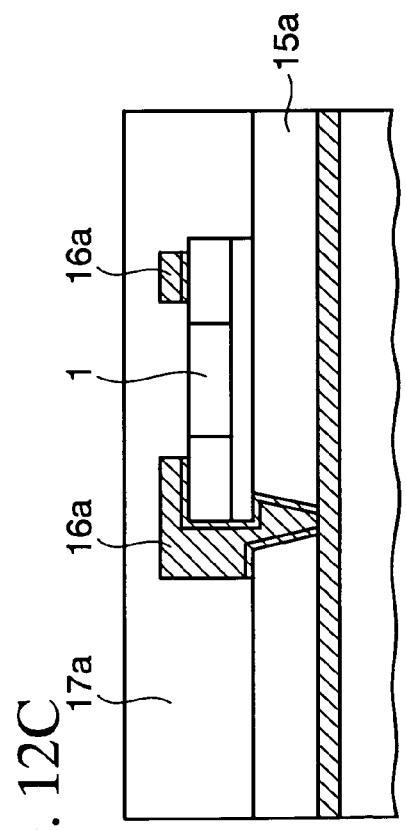

In the next step (FIG. 11E), a seed layer 33 having a thickness of approximately 1 µm is formed on the entire surface by electroless Cu plating, as in the process performed in the step of FIG. 9E.

In the next step (FIG. 11F), plating resist (resist layer 34) is formed to cover the entire surface in such a manner that specific portions of the wiring layer 14a, the resin layer 15a and the chip capacitor 1, which are covered with the seed layer 33, are exposed. The "specific portions" correspond to the portion corresponding to the position where one electrode of the chip capacitor 1 partially covers the opening region of the via hole VH2, and the portion corresponding to the position of the other electrode of the chip capacitor 1. The formation of the resist layer 34 can be performed as in the process performed in the step of FIG. 9F.

In the next step (FIG. 12A), the wiring layer 16a is formed on the seed layer 33 exposed from the resist layer 34 as in the process performed in the step of FIG. 10A. Thus, the wiring layer 16a is formed on both electrodes of the chip capacitor 1, and the wiring layer 16a on one side is connected to the ground plane (wiring layer 14a) via the seed layer 33 at this time.

In the next step (FIG. 12B), the dry film 34 is stripped off and removed. Furthermore, the exposed portion of the seed layer 33 (Cu) is removed by wet etching.

In the next step (FIG. 12C), the resin layer 17a as an interlayer insulating layer is formed on the resin layer 15a, the wiring layer 16a and the chip capacitor 1, as in the process performed in the step of FIG. 11B.

In the next step (FIG. 12D), a via hole VH3 is formed at a specific position (a position corresponding to the portion at which the wiring layer 16a on the other electrode of the chip capacitor 1 is formed) in the resin layer 17a, so as to reach the relevant wiring layer 16a, as in the process performed in the step of FIG. 10D.

In the final step (FIG. 12E), the surface of the resin layer 17a, including the inside of the via hole VH3, is electrolytically plated with Cu using the wiring layer 16a as a power-supplying layer, and a power supply plane (wiring layer 18a) having a required pattern shape is formed by a semi-additive method. Thus, the other electrode of the chip capacitor 1 is connected to the power supply plane (wiring layer 18a) via the wiring layer 16a (including the seed layer), and the portion CP2 relating to the connection mode of the chip capacitor 1 is fabricated.

Figure 13:
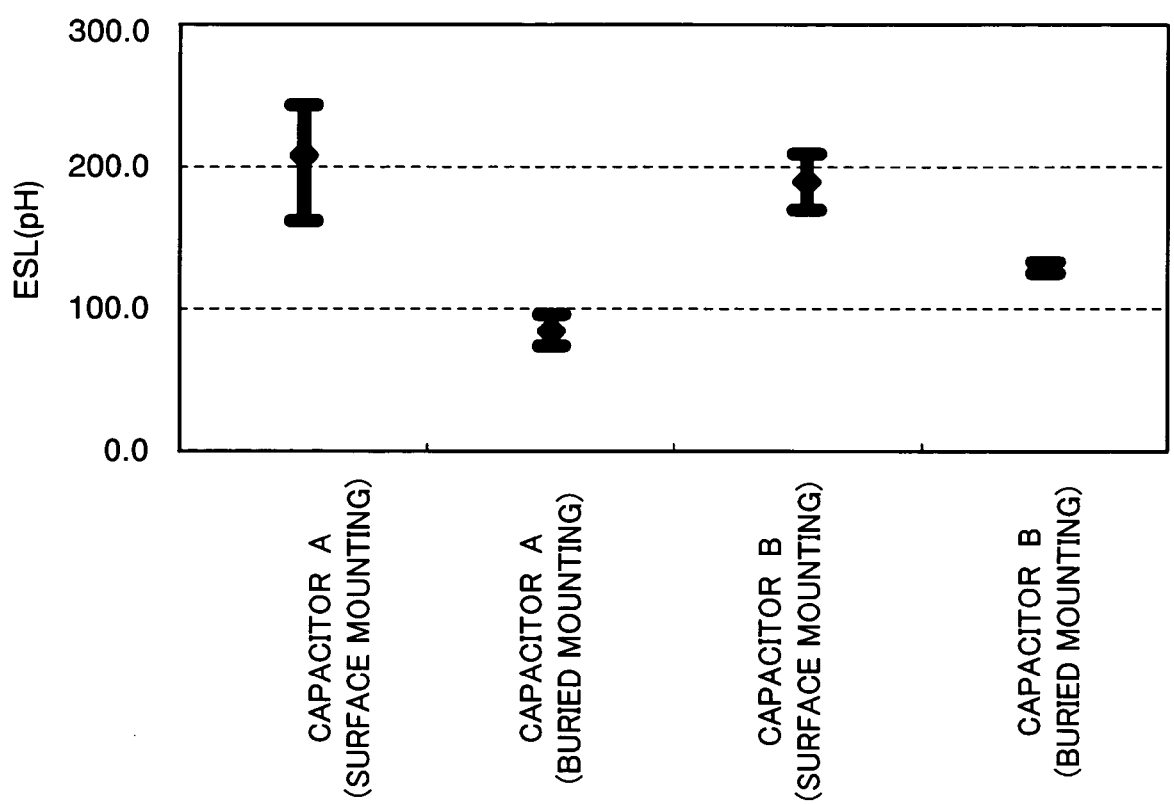
FIG. 13 is a view showing equivalent series inductances (ESL) obtained in the cases where a chip capacitor is surface-mounted and the cases where a chip capacitor is mounted in a buried manner, in comparison with each other.

FIG. 13 shows data (ESL of chip capacitors) obtained by evaluating package structures for the cases where a chip capacitor is surface-mounted and the cases where a chip capacitor is mounted in a buried manner, in comparison with each other. In the illustrated example, there is shown data obtained by evaluating what result will be obtained if a chip capacitor is simply surface-mounted or mounted in a buried manner without any consideration given to a connection to a semiconductor element to be mounted, for two types of chip capacitors A and B (two pieces for A, and two pieces for B). As for the case of buried mounting, the chip capacitor is buried in an insulating layer to be located on a ground line in such a manner that, when a current is passed through the capacitor, the direction of the current and that of a current flowing through the ground line are reversed to each other, and thus an evaluation is performed. The chip capacitors A and B have different capacitances, which are 10 nF and 5 nF, respectively. Further, the size of both chip capacitors is 1.0 mm long by 0.5 mm wide by 0.1 mm high. For the chip capacitors A, in the case of surface mounting, the average of ESL (pH) was 209.0, the difference between the maximum and average thereof was 39.0, and the difference between the minimum and average thereof was 46.0; in the case of buried mounting, the average of ESL (pH) was 84.0, the difference between the maximum and average thereof was 12.3, and the difference between the minimum and average thereof was 10.5. For the chip capacitors B, in the case of surface mounting, the average of ESL (pH) was 189.5, the difference between the maximum and average thereof was 18.5, and the difference between the minimum and average thereof was 18.5; in the case of buried mounting, the average of ESL (pH) was 128.5, the difference between the maximum and average thereof was 4.5, and the difference between the minimum and average thereof was 4.5. Results obtained by studying what package structures can be realized when knowledge obtained here is applied to an actual product are the structures of the aforementioned embodiments (FIGS. 1 to 8).

In each of the aforementioned embodiments (FIGS. 1 to 8), the description has been made by taking as an example the case where a chip capacitor as an electronic component is surface mounted or mounted in a buried manner in the relevant package. However, as apparent from the spirit of the present invention, a structure equivalent to a capacitor may be formed in the inside of or on the surface of the relevant package. A constitution example for this case is shown in FIG. 14.

Figure 14:
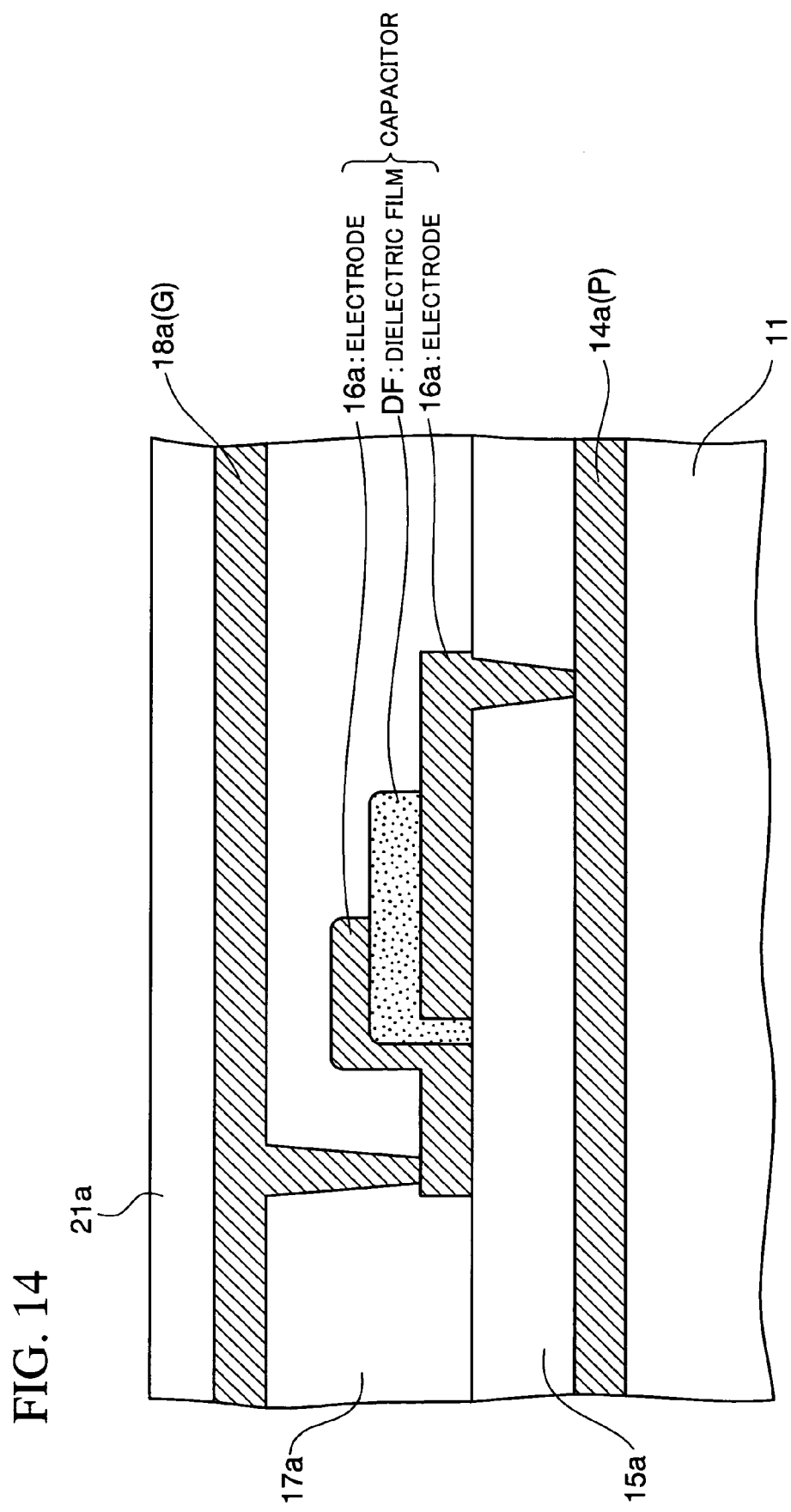
FIG. 14 is a cross-sectional view showing the constitution of a capacitor portion in a capacitor-mounted wiring board according to a modification of the embodiment shown in FIG. 6.

The constitution of FIG. 14 shows the case where, instead of the chip capacitor 1, a structure (capacitor portion) equivalent to a capacitor is formed inside the semiconductor package 10e (FIG. 6) according to the sixth embodiment. In the illustrated constitution, the capacitor portion includes the wiring layer 16a constituting one electrode (lower electrode), the wiring layer 16a constituting the other electrode (upper electrode), and a dielectric film DF formed to be sandwiched between the upper and lower electrodes. The lower electrode is connected to a power supply plane (wiring layer 14a), and the upper electrode is connected to a ground plane (wiring layer 18a). As a method of forming a capacitor inside the wiring board (package), conventional various methods can be used. As one example thereof, as described in Japanese unexamined Patent Publication 6-252528, the following method is known: a film of tantalum, aluminum, or the like is formed on an electrode, which is part of a wiring layer, by. sputtering or vapor deposition, and then this film is anodized to be formed into a dielectric film of the capacitor.

Further, in each of the aforementioned embodiments, the description has been made by taking as an example the case where one capacitor is surface-mounted or mounted in a buried manner in one package. However, two or more capacitors may be appropriately surface-mounted or mounted in a buried manner therein depending on functions required for a semiconductor element or the like to be mounted in the relevant package. Alternatively, surface-mounting and buried-mounting of capacitors may be adopted in combination as needed.

Moreover, in each of the embodiments shown in FIGS. 1 to 3, the description has been made by taking as an example the case where a capacitor is surface-mounted on the same surface of the relevant package as or the opposite surface thereof to the surface on which a semiconductor element or the like is to be mounted. However, capacitors may be surface-mounted on both surfaces of the relevant package as needed.

Furthermore, in each of the aforementioned embodiments, the description has been made by taking as an example the case where the solder bumps 22 as external connection terminals for mounting the relevant package on a mother board or the like are bonded thereto. However, it is a matter of course that the form of external connection terminals is not limited to that case. For example, pins such as used in a PGA or the like can also be adopted.

What is claimed is:

1. A capacitor-mounted wiring board comprising:
    a plurality of wiring layers each patterned in a required shape; the plurality of wiring layers being stacked with insulating layers interposed therebetween and connected to each other via conductors formed to pierce the insulating layers in a direction of thickness; and
    a capacitor surface-mounted on at least one of the same surface on which a semiconductor element, an electronic component, or the like, is to be mounted; the capacitor being mounted such that the capacitor is electrically connected to a wiring layer used as any one of a power supply line and a ground line, and in a vicinity of the wiring layer among the plurality of wiring layers, and such that, when a current is passed through the capacitor, a direction of the current and a direction of a current flowing through the wiring layer are reversed.

2. The capacitor-mounted wiring board according to claim 1, wherein the capacitor is mounted such that a path of the current flowing through the capacitor becomes approximately parallel to a path of the current flowing through the wiring layer.

3. A capacitor-mounted wiring board comprising:
    a plurality of wiring layers each patterned in a required shape; the plurality of wiring layers being stacked with insulating layers interposed therebetween and connected to each other via conductors formed to pierce the insulating layers in a direction of thickness; and
    a capacitor is mounted in a buried manner in one of the insulating layers; the capacitor being mounted such that the capacitor is electrically connected to a first wiring layer used as a power supply line and a second wiring layer used as a ground line, and among the plurality of wiring layers to be sandwiched between the first and second wiring layers;
    wherein, when a current is passed through the capacitor, a direction of the current is reversed to a direction of a current flowing through the first and second wiring layers; and, a path of the current flowing through the capacitor becomes approximately parallel to a path of the current flowing through the wiring layer.

4. The capacitor-mounted wiring board according to claim 3, wherein one electrode of the capacitor is engaged with a third wiring layer to be electrically connected to the third wiring layer, the third wiring layer being formed in an approximately L shape when viewed in a cross section and being electrically connected to the second wiring layer; and another electrode of the capacitor is electrically connected to the first wiring layer via the conductor formed to pierce the insulating layer in the direction of thickness.

5. The capacitor-mounted wiring board according to claim 3, wherein one electrode of the capacitor is engaged with a third wiring layer to be electrically connected to the third wiring layer, the third wiring layer being formed in an L shape when viewed in a cross section and being electrically connected to the second wiring layer via the conductor formed to pierce the insulating layer in the direction of thickness; and another electrode of the capacitor is electrically connected to the first wiring layer via the conductor formed to pierce the insulating layer in the direction of thickness.

* * * * *